(12) United States Patent
Park et al.

(10) Patent No.: US 6,781,871 B2
(45) Date of Patent: Aug. 24, 2004

(54) MAGNETIC RANDOM ACCESS MEMORY AND METHOD OF OPERATING THE SAME

(75) Inventors: Wan-jun Park, Seoul (KR); Tae-wan Kim, Anyang (KR); I-hun Song, Seongnam (KR); Sang-jin Park, Pyeongtaek (KR); Richard J. Gambino, Stony Brook, NY (US)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 10/316,844

(22) Filed: Dec. 12, 2002

(65) Prior Publication Data

US 2003/0117837 A1 Jun. 26, 2003

(30) Foreign Application Priority Data

Dec. 13, 2001 (KR) ........................................ 2001-78885

(51) Int. Cl.[7] .......................... G11C 11/00; G11C 11/14
(52) U.S. Cl. ...................... 365/158; 365/171; 365/173
(58) Field of Search ........................... 365/158, 50, 55, 365/173; 465/171

(56) References Cited

U.S. PATENT DOCUMENTS 6,555,858 B1 * 4/2003 Jones et al. .................. 365/66
6,606,263 B1 8/2003 Tang
2003/0206434 A1 11/2003 Leuschner

FOREIGN PATENT DOCUMENTS

KR       2000-017086       3/2000

* cited by examiner

Primary Examiner—Thong Q. Le
(74) Attorney, Agent, or Firm—Lee & Sterba, P.C.

(57) ABSTRACT

A magnetic random access memory using magnetic domain drag and giant magnetoresistance (GMR) or tunnel magnetoresistance (TMR) and a method of operating the same, wherein the magnetic random access memory includes a data storage unit including a fixed layer, a non-magnetic layer, and a free layer having two ends; a data input means electrically connected to both ends of the free layer, for applying current to the free layer to input data into the data storage unit; and a data output means electrically connected to the free layer and the fixed layer to output data stored in the data storage unit. Accordingly, a magnetic random access memory according to the present invention has superior performance than one using a switching field to record data.

15 Claims, 5 Drawing Sheets

MAGNETIC RANDOM ACCESS MEMORY AND METHOD OF OPERATING THE SAME

BACKGROUND OF THE INVENTION

1. Field of the Invention

The present invention relates to a magnetic random access memory (MRAM). More particularly, the present invention relates to an MRAM using magnetic domain drag and giant magnetoresistance (GMR) or tunnel magnetoresistance (TMR), and a method of operating the same.

2. Description of the Related Art

MRAMs are nonvolatile memory devices and new solid magnetic memories using a magnetoresistance effect based on spin dependent conduction particular to nano-magnetic substances. MRAMs use GMR or TMR, which occur because a spin, the degree of freedom of an electron, exerts great influence on electron transport.

GMR is the phenomenon where there is a resistance difference in a multi-layered structure of ferromagnetic substance/non-magnetic metal substance/ferromagnetic substance between a case where the spin arrangements formed between the two ferromagnetic substances are the same and a case where the spin arrangements formed between the two ferromagnetic substances are opposite. TMR is the phenomenon where current more easily passes through a multi-layered structure of ferromagnetic substance/isolation substance/ferromagnetic substance in a case where the spin arrangements formed between the two ferromagnetic substances are the same than in a case where the spin arrangements formed between the two ferromagnetic substances are opposite. In the case of MRAMs using GMR, since the difference between resistance values according to a magnetization direction is small, the difference between voltage values cannot be increased. In addition, the MRAMs using GMR are disadvantageous in increasing the size of a MOSFET that is combined with a GMR film in order to form a cell. Accordingly, more research has been performed to put MRAMs using a TMR film to practical use.

In recording data in conventional MRAMs, the sum of vectors in X- and Y-directions is used to select a particular cell in an array having a matrix structure of unit MRAM cells. In other words, according to a method known as an asteroid curve, data is recorded taking into account the magnetization direction of a magnetic film with respect to the sum of external magnetic fields. In conventional MRAMs, current is applied to electrode lines crossing each other above a data storage unit (GMR or TMR) to induce a magnetization direction due to a switching field formed across the electrode lines into a free layer of the data storage unit, and the magnetization direction is used as an information unit.

In order to realize memory devices that can be put to practical use, it is necessary to minimize consumption of operating power, which limits the selection of a material used for a data storage unit. In a conventional MRAM, in order to reduce a switching field, i.e., consumed power, a Permalloy (NiFe) is most widely used for a free layer of a magnetoresistance device. It is essential to increase magnetoresistance in order to increase the operating speed of an MRAM and efficiently design a chip architecture. For this, a magnetic film used for a free layer must have a ferromagnetic characteristic and a high polarization characteristic. In order to obtain these characteristics, a NiCoFe alloy, half metallic alloy, magnetic amorphous alloy, or the like may be used, but these magnetic substances have a large switching field, so they cannot be easily applied to conventional MRAMs. In other words, for a large switching field, the width and thickness of an electrode line need to be greater than predetermined measures, so it is difficult to apply the above magnetic substances to memory devices requiring a high density of integration.

Meanwhile, when information is recorded in or reproduced from an array of memory devices using the sum of vectors in X- and Y-directions, two independent writing sources are needed, thereby complicating chip architecture.

SUMMARY OF THE INVENTION

In an effort to solve the problems described above, it is a feature of an embodiment of the present invention to provide a micro-magnetic random access memory (MRAM) device and array that do not require a switching field, are able to minimize power consumption, have a simple structure, can increase operating speed, and have a size in accordance with a magnetic domain size, thereby realizing a micro-memory device.

To provide the feature of the present invention described above, there is provided a magnetic random access memory including a data storage unit including a fixed layer, a non-magnetic layer, and a free layer having two ends; a data input means electrically connected to both ends of the free layer, for applying current to the free layer to input data into the data storage unit; and a data output means electrically connected to the free layer and the fixed layer to output data stored in the data storage unit.

Preferably, the data input means is a data input unit and the data output means is a data output unit.

Preferably, the fixed layer and the free layer are formed of a ferromagnetic substance, and the free layer includes at least one magnetic domain wall.

Preferably, the data input means includes a data input line through which current is applied to the free layer to determine a magnetization direction; and a data input selection switch formed between one end of the free layer and the data input line. Preferably, the data output means includes a bit line formed on the free layer, and a data output selection switch connected to a bottom of the fixed layer.

Preferably, each of the data input selection switch and the data output selection switch is a diode, a MOS transistor, or a bipolar transistor.

Another embodiment of the present invention also provides a magnetic random access memory array having a matrix structure of unit memory devices each including a data storage unit including a fixed layer, a non-magnetic layer, and a free layer having two ends; a data input means electrically connected to both ends of the free layer to input data into the data storage unit; and a data output means electrically connected to the free layer and the fixed layer to output data stored in the data storage unit. The data input means and the data output means are electrically connected to an input selection decoder and an output selection decoder, respectively, within the magnetic random access memory array to select a particular unit memory device.

Preferably, the data input means includes a data input line through which current is applied to the free layer to determine a magnetization direction, and a data input selection switch formed between one end of the free layer and the data input line and electrically driven by the input selection decoder. The data output means preferably includes a bit line formed on the free layer, and a data output selection switch connected to a bottom of the fixed layer and electrically driven by the output selection decoder.

Preferably, the magnetic random access memory array further includes a reference column composed of reference memory units in each of which the magnetization direction of a free layer of a data storage unit is fixed, and wherein bit lines of the unit memory devices and a bit line of the reference memory units are connected to a comparator.

In order to provide another feature of an embodiment of the present invention, there is provided a method of operating a magnetic random access memory array including an array having a matrix structure of unit memory devices each including a data storage unit having a fixed layer, a non-magnetic layer, and a free layer having two ends; a data input means electrically connected to both ends of the free layer to input data into the data storage unit; and a data output means electrically connected to the free layer and the fixed layer to output data stored in the data storage unit; and an input selection decoder and an output selection decoder electrically connected to the data input means and the data output means, respectively, to select a particular unit memory device in the array. The method includes (a) selecting a particular unit memory device using the input selection decoder, and forming a spin arrangement in a predetermined direction within a magnetic domain of the free layer of the data storage unit by applying current to the selected unit memory device using the data input unit, thereby storing data; and (b) driving an output selection switch connected to a particular unit memory device using the output selection decoder and reading data from the data storage unit using the data output unit.

Preferably, the data input means includes a data input line through which current is applied to the free layer to determine a magnetization direction, and a data input selection switch formed between one end of the free layer and the data input line and electrically driven by the input selection decoder. Here, (a) includes driving the data input selection switch using the input selection decoder, and forming a spin arrangement in a predetermined direction within a magnetic domain of the free layer through the data input line.

The data output means includes a bit line formed on the free layer, and a data output selection switch connected to a bottom of the fixed layer and electrically driven by the output selection decoder. Here, (b) includes driving the data output selection switch using the output selection decoder, and measuring a resistance value between the fixed layer and the free layer of the data storage unit to read data.

Preferably, the array further includes a reference column composed of reference memory units in each of which the magnetization direction of a free layer of a data storage unit is fixed, and bit lines of the unit memory devices and a bit line of the reference memory units are connected to a comparator. Here, (b) further includes comparing a resistance value of the data storage unit of the unit memory device with a fixed resistance value of the data storage unit of a reference memory unit corresponding to the unit memory device to output data stored in the unit memory device.

BRIEF DESCRIPTION OF THE DRAWINGS

The above and other features and advantages of the present invention will become more apparent upon review of a detailed description of preferred embodiments thereof with reference to the attached drawings in which.

DETAILED DESCRIPTION OF THE INVENTION

Korean Patent Application No. 2001-78885, filed on Dec. 13, 2001, and entitled: "Magnetic Random Access Memory and Method of Operating the Same," is incorporated by reference herein in its entirety.

Principles of recording data in and reproducing data from a data storage unit used in a magnetic random access memory (MRAM) device according to an embodiment of the present invention will be described with reference to FIGS. 1A through 2B. In general, a MRAM device includes a giant magnetoresistance (GMR) device or tunnel magnetoresistance (TMR) device as a data storage unit, two switches for selecting a unit cell on an entire array to record data in or reproduce data from the data storage unit, and an electrical connection line which is a path through which a data signal is input or output.

Figure 1A:
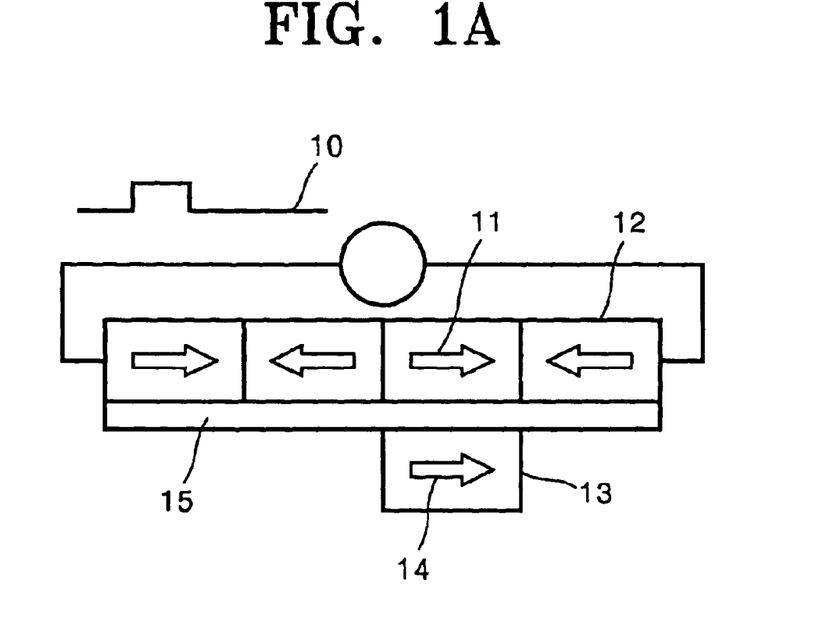
FIGS. 1A through 1B illustrate diagrams for explaining the data input principle of a magnetic random access memory (MRAM) device according to an embodiment of the present invention.
Figure 1B:
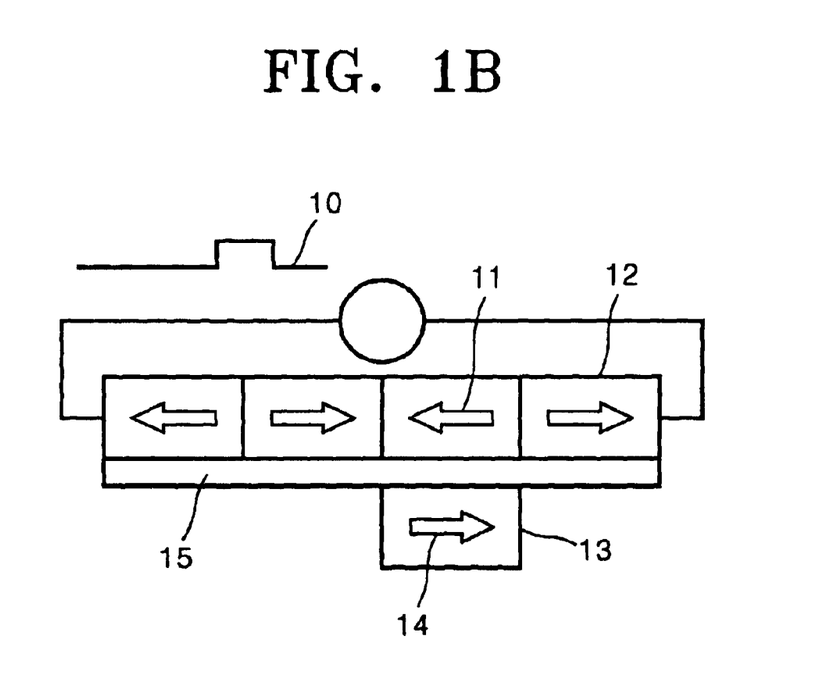

A GMR or TMR device, which is a data storage unit of the MRAM according to an embodiment of the present invention, is composed of multi-layers: a fixed layer, a non-magnetic layer, and a free layer. Data input/output values vary with the switching direction of the free layer.

A non-magnetic layer 15 is formed on a fixed layer 13 in which a magnetization direction 14 of the fixed layer 13 is fixed at a certain direction. A free layer 12 is formed on the non-magnetic layer 15. The non-magnetic layer 15 is a non-magnetic metal layer or an oxide layer and is formed between the fixed layer 13 and the free layer 12 to magnetically separate them. The free layer 12 has a magnetic domain wall. The magnetic domain wall is naturally formed, or the width thereof may be adjusted by the type or deposition conditions of a ferromagnetic substance forming the free layer 12. The fixed layer 13 is composed of a ferromagnetic layer and an anti-ferromagnetic layer.

A data recording principle will now be described. Generally, there are several methods of establishing and changing the magnetization direction of a magnetic domain. First, the magnetization direction of a free layer of an information storage unit may be determined using the switching field of a magnetoresistance device with respect to the free layer. Second, a magnetization direction may be determined using an electron spin and a magnetization interaction. Third, a magnetization direction may be determined using the direction of current applied to a magnetic domain. An MRAM according to the present invention employs the third method.

If direct or alternating current is applied to both ends of the free layer 12, the current flows in the form of a pulse 10. Here, the magnetization direction 11 of a magnetic domain of the free layer 12 corresponding to the fixed layer 13 changes depending on the direction of the current. The magnetization direction 11 is assigned a data value of 0 or 1. If current is applied in an opposite direction to FIG. 1A, the magnetization direction 11 is opposite to FIG. 1A, as shown in FIG. 1B. Here, the magnetization direction 11 is assigned a data value different from that assigned in FIG. 1A. In other words, when the magnetization direction 11 is assigned "0" in FIG. 1A, it is assigned "1" in FIG. 1B.

Figure 2A:
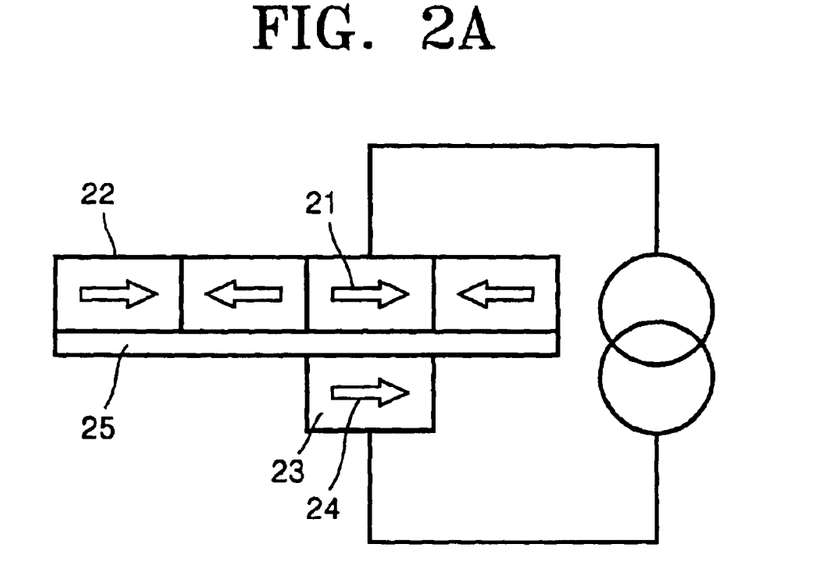
FIGS. 2A and 2B illustrate diagrams for explaining the data output principle of an MRAM device according to an embodiment of the present invention.
Figure 2B:
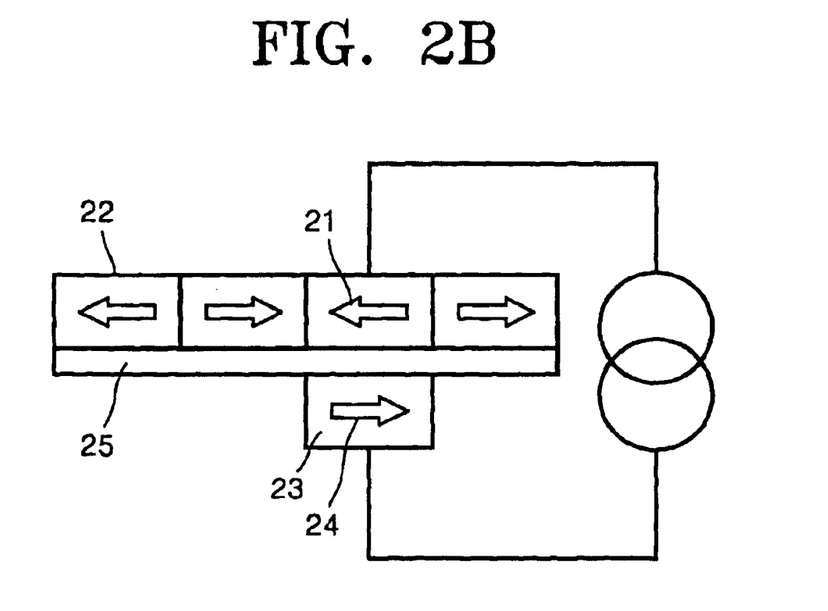

A data output principle will now be described with reference to FIGS. 2A and 2B. The data output principle for an MRAM according to the present invention is the same as that for a conventional MRAM.

Current is applied to the bottom and top, respectively, of a fixed layer 23 and a free layer 22 of a data storage unit, and a resistance value between the fixed layer 23 and the free layer 22 is measured. A non-magnetic layer 25 is formed between the fixed layer 23 and the free layer 22 to magnetically separate the layers. The magnetization directions 24 and 21 of the respective fixed and free layers 23 and 22 are the same in FIG. 2A, and they are opposite in FIG. 2B. Accordingly, as in general magnetoresistance devices, resistance is greater in the MRAM device shown in FIG. 2B than in the MRAM device shown in FIG. 2A, and such resistance difference enables recognition of a stored data value.

Figure 3A:
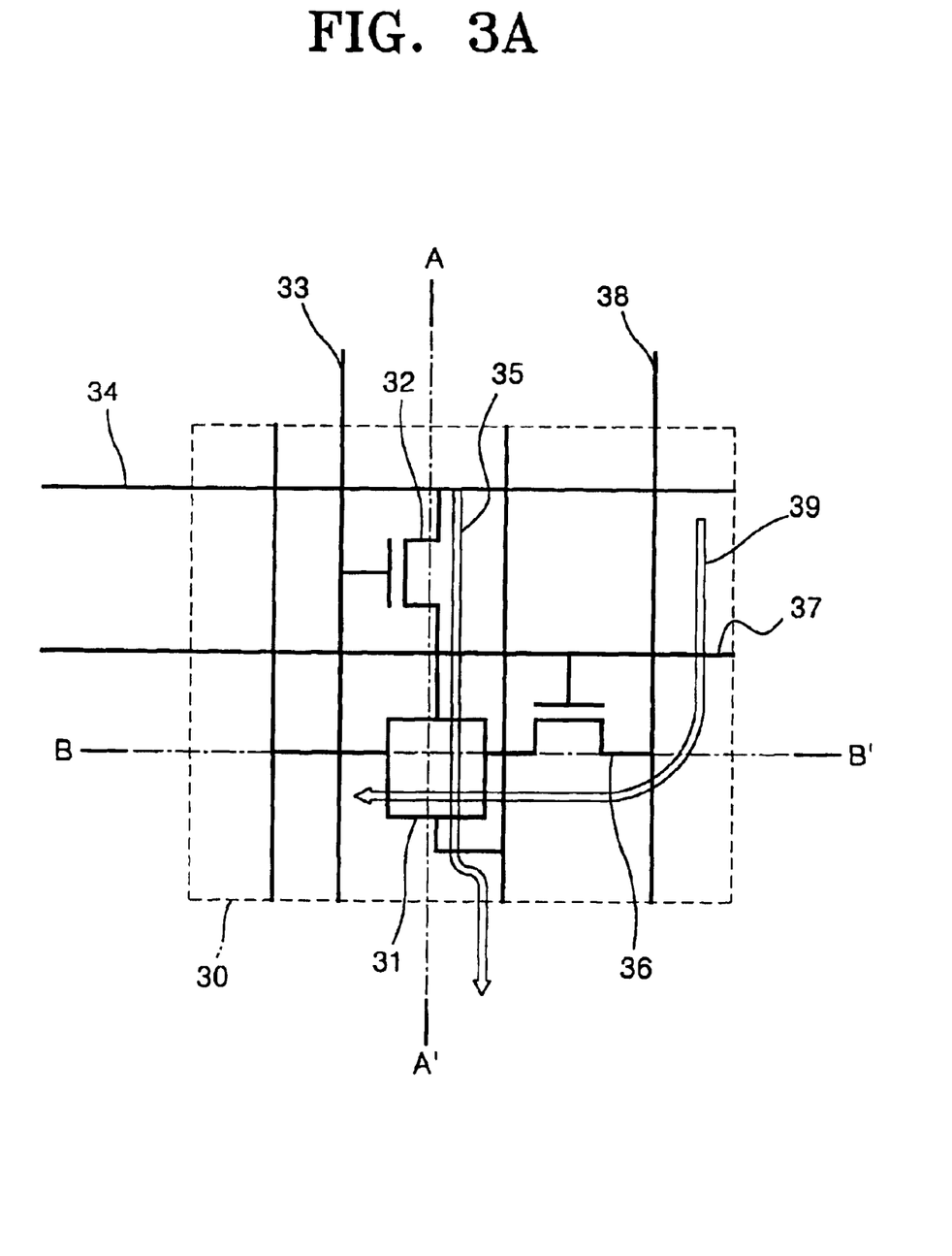
FIG. 3A illustrates an equivalent circuit diagram of a unit MRAM cell according to an embodiment of the present invention.
Figure 3B:
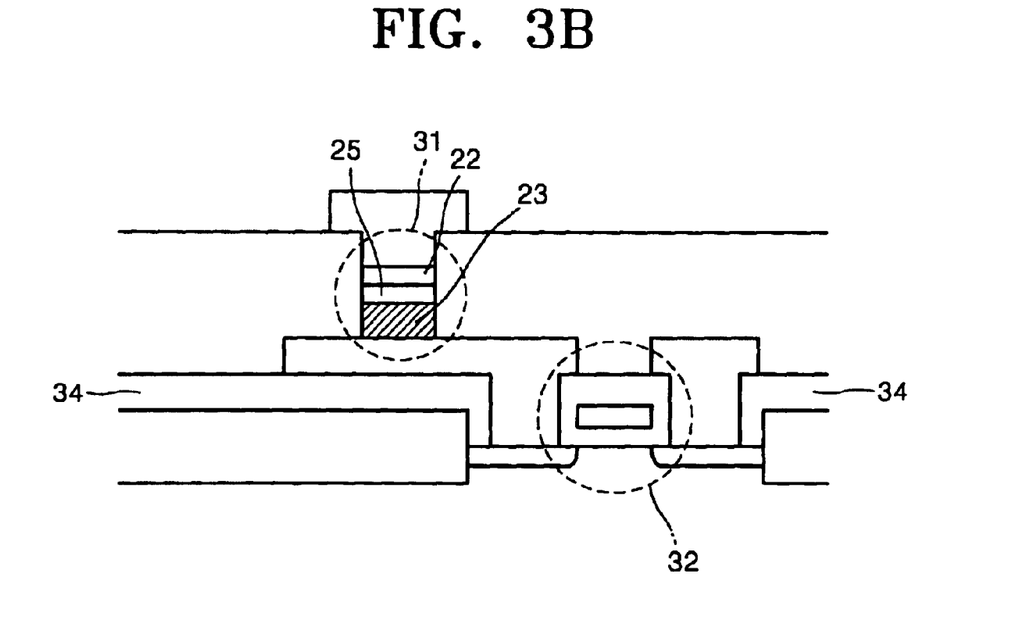
FIGS. 3B and 3C illustrate sectional views of an MRAM device according to an embodiment of the present invention.
Figure 3C:
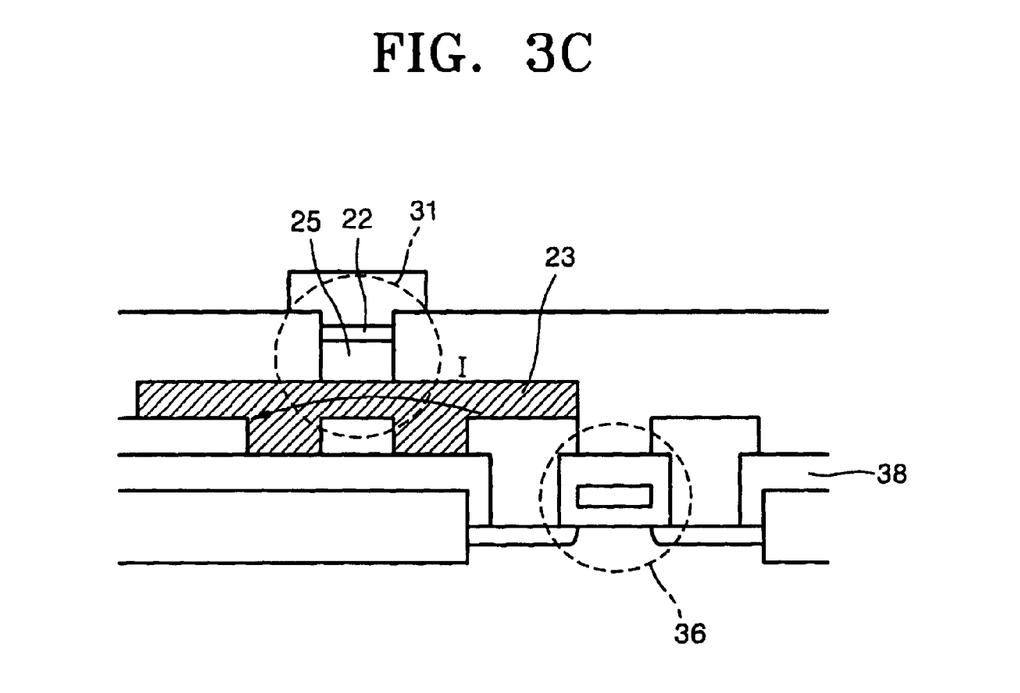

An MRAM device according to an embodiment of the present invention will be described with reference to FIGS. 3A through 3C. FIG. 3A illustrates an equivalent circuit diagram of an MRAM device according to the present invention. FIGS. 3B and 3C illustrate sectional views of the MRAM device of FIG. 3A, taken along the lines A-A' and B-B', respectively.

An MRAM device according to an embodiment of the present invention includes a data storage unit 31 in which information is recorded or from which information is reproduced, two switches 32 and 36 for selecting the predetermined data storage unit 31 in an entire memory array, and an electrical connection line through which a data signal is input to or output from the data storage unit 31. A data input unit and a data output unit are required to store data in and read data from the data storage unit 31. Accordingly, in order to select a unit cell in an entire array for input and output, the input selection switch 36 and the output selection switch 32 are required.

As described above, a data storage unit 31 of an MRAM device according to the present invention is a magnetoresistance device and is realized as a GMR or TMR device. The data storage unit 31 has a multi-layered structure of fixed layer/non-magnetic layer/free layer. The free layer includes a plurality of magnetic domains. A switch of the MRAM device may be realized as a device such as a diode, MOS transistor, or bipolar transistor capable of performing a switch function.

In an embodiment of the present invention, two switches are used. One switch is connected to the free layer in series, and the other switch is vertically connected to the free layer and fixed layer of the data storage unit, forming an electrical junction structure.

Operations of a unit cell having an MRAM structure according to the present invention will be described with reference to FIG. 3A. The operations of an MRAM device are classified into selection of a corresponding cell in an array having a matrix structure of a plurality of unit cells 30 and recording or reproducing of data in or from the selected cell.

In inputting data, a single unit cell 30 in an MRAM array is selected by an input selection line 37 and a data input line 38. Then, data information provided from the data input line 38 is recorded in the data storage unit 31 through the input selection switch 36. As described above, in the free layer of the data storage unit 31, the magnetization direction is determined according to the direction of current flowing in the data input line 38. According to the magnetization direction, a data value of "0" or "1" is determined and recorded. Here, reference numeral 39 denotes a data input path.

Next, in outputting data, the data is read from an MRAM unit cell, which is selected by an output selection line 33, i.e., a word line, and a bit line 34, by reading a resistance difference according to the magnetization directions of the respective fixed layer and free layer of the data storage unit 31 using a sense amplifier (S/A) or the like. Here, reference numeral 35 denotes a data output path.

Figure 4:
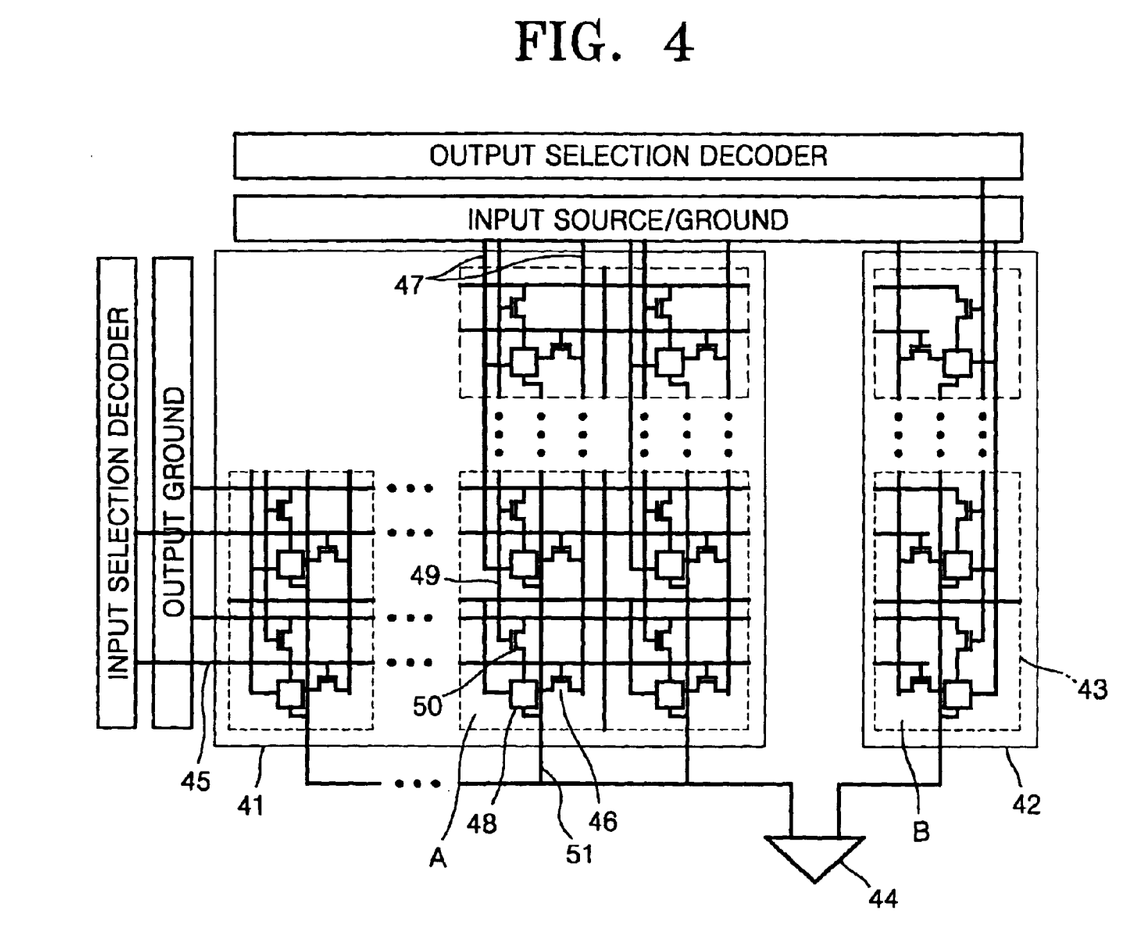
FIG. 4 illustrates an equivalent circuit diagram of an MRAM array according to an embodiment of the present invention.

FIG. 4 illustrates an equivalent circuit diagram of an array having a matrix structure of a plurality of the above-described MRAM unit cells. A plurality of unit cells are connected to form a plurality of columns 41, and a reference column 42 is employed. An MRAM unit cell in a particular memory column is selected. A signal of the selected MRAM unit cell is compared with a signal of a reference cell in the reference column 42 positioned on the same line using a comparator 44 to read a data value of "0" or "1" stored in a data storage unit of the selected MRAM unit cell. In a free layer in each of reference cells 43, an initial spin direction is fixed and is used as a reference for data values stored in usual MRAM unit cells.

With reference to FIG. 4, a data input process, that is, a data write process, will be described first. In the case where a unit cell A is selected in an entire MRAM array, an input selection decoder supplies power to an input selection line 45 connected to the unit cell A to turn on a data input selection switch 46. An input source/ground applies current to the unit cell A through a data input line 47 to determine a magnetization direction within a magnetic domain of a free layer of a data storage unit 48. The data input line 47 is electrically connected to both sides of the free layer of each of unit cells. In a data write process, data is stored in a data storage unit according to the spin arrangement, that is, the magnetization direction, of the free layer.

Next, a data output process, that is, a data read process, will be described. An output selection decoder supplies power to an output selection line 49, that is, a word line, connected to the unit cell A. In other words, the desired unit cell A is selected through the output selection line 49, and a data output selection switch 50 of the unit cell A is turned on. Next, power is applied to a bit line 51, and a resistance difference between the free layer and the fixed layer of the data storage unit 48 is read.

A preferred MRAM array according to the present invention is provided with a reference cell which has the same structure as an MRAM unit cell and has a fixed magnetization direction, i.e., a fixed spin arrangement, in a free layer thereof. In other words, in selecting a desired MRAM unit cell, a reference cell formed on the same line as that of the desired MRAM unit cell is simultaneously selected in the reference column 42, and a resistance value thereof is read. Here, the resistance value of the desired MRAM unit cell is compared with the resistance value of the selected reference cell by the comparator 44. The comparator 44 is connected to the bit lines of usual MRAM unit cells and to the bit line of reference cells in the reference column 42.

As shown in FIG. 4, in reading a data value from the MRAM unit cell A, a reference cell B sharing an output ground with the MRAM unit cell A is selected in the reference column 42, and the resistance values of the reference cell B and the MRAM unit cell A are compared by the comparator 44. The magnetization direction of the free layer of the reference cell B is fixed. By comparison of the resistance values, a data value stored in the MRAM unit cell A is determined as "0" or "1".

The present invention eliminates the problems of conventional technology using a switching field and provides an MRAM capable of using a magnetic thin film having a high polarization characteristic with low driving power. In addition, the present invention provides an MRAM unit cell having a size in accordance with a magnetic domain size so that data can be stored in or read from a data storage unit in a very simple structure. Accordingly, an MRAM having a high integration density may be realized by the present invention.

Preferred embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A magnetic random access memory comprising:
    a data storage unit including a fixed layer, a non-magnetic layer, and a free layer having two ends;
    a data input means electrically connected to both ends of the free layer, for applying current to the free layer to input data into the data storage unit; and
    a data output means electrically connected to the free layer and the fixed layer to output data stored in the data storage unit.

2. The magnetic random access memory as claimed in claim 1, wherein the data input means is a data input unit and the data output means is a data output unit.

3. The magnetic random access memory as claimed in claim 1, wherein the fixed layer and the free layer are formed of a ferromagnetic substance, and the free layer includes at least one magnetic domain wall.

4. The magnetic random access memory as claimed in claim 3, wherein the data input means comprises:
    a data input line through which current is applied to the free layer to determine a magnetization direction; and
    a data input selection switch formed between one end of the free layer and the data input line.

5. The magnetic random access memory as claimed in claim 3, wherein the data output means comprises:
    a bit line formed on the free layer; and
    a data output selection switch connected to a bottom of the fixed layer.

6. The magnetic random access memory as claimed in claim 5, wherein each of the data input selection switch and the data output selection switch is one selected from the group consisting of a diode, a MOS transistor, and a bipolar transistor.

7. A magnetic random access memory array having a matrix structure of unit memory devices each including a data storage unit comprising:
    a fixed layer, a non-magnetic layer, and a free layer having two ends;
    a data input means electrically connected to both ends of the free layer to input data into the data storage unit; and
    a data output means electrically connected to the free layer and the fixed layer to output data stored in the data storage unit,
    wherein the data input means and the data output means are electrically connected to an input selection decoder and output selection decoder, respectively, within the magnetic random access memory array to select a particular unit memory device.

8. The magnetic random access memory claimed in claim 7, wherein the data input means is a data input unit and the data output means is a data output unit.

9. The magnetic random access memory array as claimed in claim 7, wherein the data input means comprises:
    a data input line through which current is applied to the free layer to determine a magnetization direction; and
    a data input selection switch formed between one end of the free layer and the data input line and electrically driven by the input selection decoder, and
    wherein the data output means includes:
    a bit line formed on the free layer; and
    a data output selection switch connected to a bottom of the fixed layer and electrically driven by the output selection decoder.

10. The magnetic random access memory array as claimed in claim 9, further comprising a reference column composed of reference memory units in each of which the magnetization direction free layer of a data storage unit is fixed, wherein bit lines of the unit memory devices and a bit line of the reference memory units are connected to a comparator.

11. A method of operating a magnetic random access memory array including an array having a matrix structure of unit memory devices each including a data storage unit having a fixed layer, a non-magnetic layer, and a free layer having two ends; a data input means electrically connected to both ends of the free layer to input data into the data storage unit; and a data output means electrically connected to the free layer and the fixed layer to output data stored in the data storage unit; and an input selection decoder and an output selection decoder electrically connected to the data input means and the data output means, respectively, to select a particular unit memory device in the array, the method comprising:
    (a) selecting a particular unit memory device using the input selection decoder, and forming a spin arrangement in a predetermined direction within a magnetic domain of the free layer of the data storage unit by applying current to the selected unit memory device using the data input means, thereby storing data; and
    (b) driving an output selection switch connected to particular unit memory device using the output selection decoder and reading data from the data storage unit using the data output means.

12. The magnetic random access memory as claimed in claim 11, wherein the data input means is a data input unit and the data output means is a data output unit.

13. The method as claimed in claim 11, wherein the data input means comprises:
    a data input line through which current is applied to the free layer to determine a magnetization direction; and
    a data input selection switch formed between one end of the free layer and the data input line and electrically driven by the input selection decoder, wherein (a) includes:
    (a1) driving the data input selection switch using the input selection decoder; and
    (a2) forming a spin arrangement in a predetermined direction within a magnetic domain of the free layer through the data input line.

14. The method as claimed in claim 11, wherein the data output means comprises:

a bit line formed on the free layer; and a data output selection switch connected to a bottom of the fixed layer and electrically driven by the output selection decoder, wherein (b) includes:

(b1) driving data output selection switch using the output selection decoder; and (b2) measuring a resistance value between the fixed layer and the free layer of the data storage unit to read data.

15. The method as claimed in claim 14, wherein the array further comprises:

a reference column composed of reference memory units in each of which the magnetization direction of a free layer of a data storage unit is fixed; and bit lines of the unit memory devices and a bit line of the reference memory units are connected to a comparator, wherein (b) further includes:

(b3) comparing a resistance value of the data storage unit of the unit memory device with a fixed resistance value of the data storage unit of a reference memory unit corresponding to the unit memory device to output data stored in the unit memory device.

* * * * *